United States Patent [19]
LaBrie et al.

[11] Patent Number: 6,030,451
[45] Date of Patent: Feb. 29, 2000

[54] TWO CAMERA DIAMETER CONTROL SYSTEM WITH DIAMETER TRACKING FOR SILICON INGOT GROWTH

[75] Inventors: Aaron LaBrie; Masahiko Baba, both of Vancouver, Wash.

[73] Assignee: SEH America, Inc., Vancouver, Wash.

[21] Appl. No.: 09/005,773

[22] Filed: Jan. 12, 1998

[51] Int. Cl.[7] ................................................. C30B 15/22
[52] U.S. Cl. .............................. 117/14; 117/201; 117/202
[58] Field of Search .................................. 117/13, 14, 15, 117/201, 202, 900

[56] References Cited

U.S. PATENT DOCUMENTS

| | | |
|---|---|---|
| 3,998,598 | 12/1976 | Bonora . |
| 4,350,557 | 9/1982 | Scholl et al. . |
| 4,915,775 | 4/1990 | Katsuoka et al. . |
| 5,138,179 | 8/1992 | Baba et al. . |
| 5,240,684 | 8/1993 | Baba et al. ............................. 117/208 |
| 5,471,943 | 12/1995 | Scheel ..................................... 117/20 |
| 5,584,930 | 12/1996 | Katsuoka et al. ....................... 117/14 |
| 5,653,799 | 8/1997 | Fuerhoff . |
| 5,656,078 | 8/1997 | Fuerhoff . |
| 5,660,629 | 8/1997 | Shiraishi et al. ........................ 117/201 |
| 5,665,159 | 9/1997 | Fuerhoff ................................. 117/201 |
| 5,746,825 | 5/1998 | Von Ammon et al. . |

OTHER PUBLICATIONS

*IBM Technical Disclosure Bulletin*, vol. 27, No. 10A, Mar. 1985.

Digges et al., "The Basis of Automatic Diameter Control Utilizing 'Bright Ring' Meniscus Reflections", *Journal of Crystal Growth* 29 (1975) 326–328.

*Primary Examiner*—Felisa Garrett
*Attorney, Agent, or Firm*—Evenson, McKeown, Edwards & Lenahan, P.L.L.C.

[57] ABSTRACT

A method and apparatus for measuring and controlling the diameter of a silicon single crystal ingot grown by the Czochralski technique using dual optical cameras focused on diametrically opposed edges of the meniscus of the growing crystal to measure the actual crystal diameter. The crystal growth parameters can be adjusted in response to the measured diameter to maintain a constant, desired diameter. The method and apparatus of the invention provide a continuous accurate measurement of the crystal diameter and avoid unnecessary adjustments to the crystal growth conditions resulting from diameter measurement errors due to the effects of crystal orbit, melt level changes and camera angle variations.

11 Claims, 3 Drawing Sheets

TWO CAMERA DIAMETER CONTROL SYSTEM WITH DIAMETER TRACKING FOR SILICON INGOT GROWTH

BACKGROUND OF THE INVENTION

1. Field of the Invention

This invention relates to a method of and a device for simultaneous crystal diameter measurement to be used in an apparatus for automatically controlling single crystal growth by the Czochralski technique.

2. Description of the State of the Art

A basic description of the use of observations by a single visual camera of the meniscus of the solid-liquid interface in growing a silicon single crystal by the Czochralski technique in order to monitor and control the diameter of the resulting crystal is given by Diggs et al. in their article, The Basis of Automatic Diameter Control Utilizing "Bright Ring" Meniscus reflection, in *Journal of Crystal Growth*, 29:326–28 (1975).

The use of a laser, as opposed to an optical camera, to measure the diameter of a growing crystal was described in Monitoring Diameter Variation and Diameter Control Using Laser Beam and Image Processing Czochralski Crystal Growth, *IBM Technical Disclosure Bulletin*, Vol. 27, No. 10A, pages 5777–5778 (1985). This document also gives a basic description of control methodology for automatically changing growth parameters when a diameter deviation occurs to bring the diameter back to its target value.

Baba et al., U.S. Pat. No. 5,138,179, discloses using a single camera for diameter measurement on growth of neck section of a crystal and describes the interaction between the optical camera and automated crystal growth controls.

Bonora, U.S. Pat. No. 3,998,598 discusses the role of melt level in measuring diameter with an optical pyrometer and indicates that moving the melt level while growing results in unwanted flats in the crystal. Bonora thus teaches to adjust the angle of the pyrometer or camera and the mathematical formulas used to calculate diameter in order to maintain optical diameter accuracy as the melt level is reduced.

Katsuoka et al., U.S. Pat. No. 4,915,775, discloses a technique for optically calibrating the melt level location before crystal growing commences and then maintaining the melt level through mathematical algorithms throughout the crystal growth process.

Scholl et al., U.S. Pat. No. 4,350,557, discloses a method of attaching a sensor to the pulling cable that triggers a receiver, allowing the machine to determine each time the crystal has made a complete revolution, so that a radiation sensitive controller can then measure an integrated radiation signal around the circumference of the crystal at the melt meniscus.

Fuerhoff U.S. Pat. Nos. 5,653,799 and 5,656,078 disclose a method for controlling growth of a silicon crystal and a video camera for use in a system for controlling growth of a silicon crystal. The melt from which the crystal is pulled has a surface with a meniscus which is visible as a bright ring adjacent the crystal. A video camera generates an image pattern of a portion of the bright ring, and image processing circuitry defines an edge of the bright ring and a generally circular shape including this defined edge. The diameter of the crystal is then determined from the defined circular shape.

A conventional method of crystal diameter measurement, as illustrated in FIG. 1, shows a luminous ring 74, which is formed at the interface between the surface of a silicon melt 42 and a single silicon crystal 40 being pulled out of the melt. This luminous ring 74 is photographed by a single CCD camera, and the resulting video signal is binary-coded to obtain a binary image contained in an automatic control system. A particular portion such as in inner diameter $D_i$ 70, or the outer diameter $D_o$ 72, contained in this binary image is detected and multiplied by precalculated constants to determine the diameter of the crystal being grown. This diameter, however, is calculated with the assumption that the center of the crystal is at a known place, and as such the uses the location of the optically detected luminous ring 74 to calculate the distance from the detected point on the luminous ring 74 to the theoretical center of the ingot to calculate a radius, which is then converted to a diameter.

Although generally effective, there are several issues that can effect the accuracy of the diameter calculations. One key factor encompasses a phenomenon known as orbit. As the crystal is being grown it is rotated around its longitudinal axis at a controlled rate. If the mass of the crystal or the various mechanical parts used to hold and raise the crystal from the melt is not perfectly centered along the longitudinal axis of the crystal, the entire crystal will swing in a circular motion. This swinging motion is known as orbit. Obviously, as the crystal orbits in the melt, the luminous ring 74 moves, causing the camera to incorrectly perceive that the diameter of the crystal is changing rather than sensing orbit. The automated control system then tries to compensate for the incorrectly perceived diameter change by adjusting temperature and/or pulling speed, resulting in an actual loss of diameter control.

Another phenomenon that can affect the diameter calculations when using the above described conventional method is the location of the melt level in the crucible.

Camera angle can also play a critical role in diameter measurement accuracy. The camera is "calibrated" to a known specific angle to the viewing area. This known angle is used in the mathematical algorithms for calculating ingot diameter. If the camera is bumped or moved after calibration, the theoretical calculations are incorrect due to the predicted sensing location and the actual sensing location not being the same.

Using a prior art system as described above, the total diameter error is then the sum of the orbit error, twice the melt level error, and the camera angle change error. Although it is possible to have the errors offset each other, such as having one error indicate a smaller than actual diameter while another indicates a larger than actual diameter, it is unfortunately also possible to have all errors indicate diameter that is either too small or too large. This compounding of errors is a worst case scenario, and can result in significant material loss due to oversized, or undersized crystals. Thus there has remained a need in the art for a more accurate and reliable method and apparatus for measuring and controlling the diameter of a silicon single crystal grown by the Czochralski technique.

SUMMARY OF THE INVENTION

It is an aim of the invention to provide an improved method and apparatus for measuring the diameter of a silicon single crystal grown by the Czochralski technique.

Another aim of the invention is to provide a method and apparatus for measuring the diameter of a pulled crystal which is not subject to measurement errors due to crystal orbit, melt level variations and/or camera angle changes.

A further aim of the invention is to provide a method and apparatus for measuring the diameter of a pulled crystal which facilitates continuous monitoring of the diameter and adjustment of the crystal growth conditions.

These and other aims have been achieved by the present invention which makes use of a dual camera system to measure the diameter of the crystal through optical recognition of the meniscus of the crystal-melt interface on opposite sides of the growing crystal. The result of this is an optical diameter control method that eliminates the negative effects of orbit, melt level, and incorrect camera angles. The two cameras are positioned such that each camera will focus on a respective one of the two diametrically opposed edges on the circumference of the crystal as it is being grown. The actual diameter of the crystal at the melt meniscus is measured by the two camera system on a continual basis. The present invention thus makes it possible to continuously optically measure the true diameter of a growing crystal independent of the melt level from necking clear through crystal growth.

BRIEF DESCRIPTION OF THE DRAWINGS

The invention will be described in further detail hereinafter with reference to the accompanying drawings in which.

DETAILED DESCRIPTION OF PREFERRED EMBODIMENTS

Figure 2:
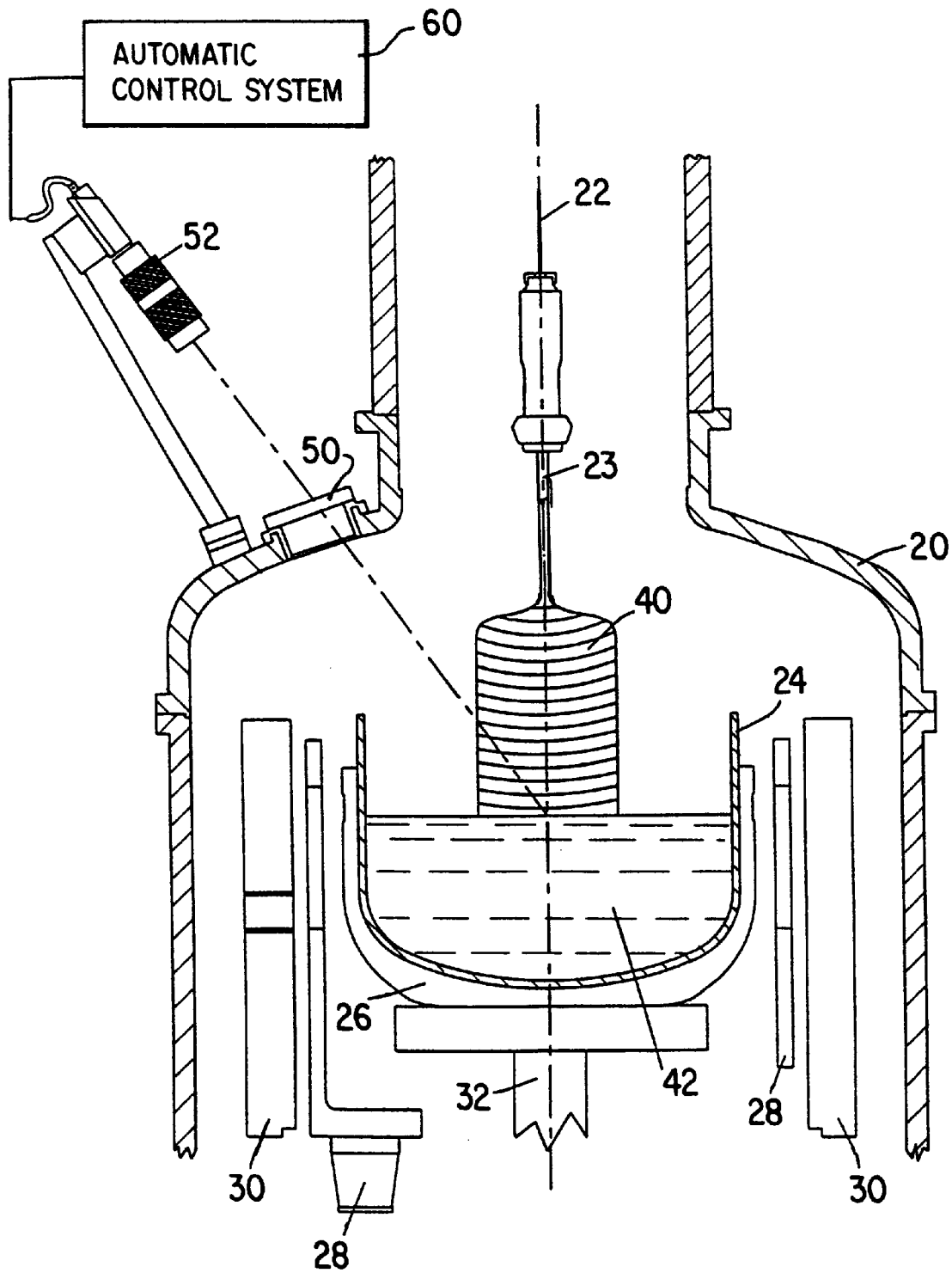
FIG. 2 is a schematic representation of an apparatus for growing a single silicon crystal according to the Czochralski technique.

FIG. 2 illustrates the essential parts of a diameter controlling device for automatic crystal growth control in a Czochralski crystal pulling system. A graphite susceptor 26 is fastened to the top of a rotatable shaft 32. Housed inside the graphite susceptor 26 is a quartz crucible 24, which holds the molten silicon 42. The graphite susceptor 26 is surrounded by a heater 28, which is then surrounded by a heat insulator 30. Attached to the lower end of a rotatable wire 22, adapted to be raised and lowered by a motor (not shown) arranged above the molten silicon 42, is a seed crystal 23 used to properly grow the crystal 40. This entire system is housed by a growing chamber 20. Attached to the growing chamber 20 is a view port 50, and a pair of CCD cameras 52 and 53, only camera 52 of which can be seen in FIG. 2. The CCD cameras 52 and 53 are electronically connected to an automatic control system 60 which is used to interpret the signals produced by the CCD cameras 52 and 53, and automatically control such growth parameters of the crystal as crystal lift rate, crucible lift rate, and temperature. It should be noted that all figures are for illustration only, are not drawn to scale, and are not all-inclusive of the Czochralski crystal growing system.

Figure 1:
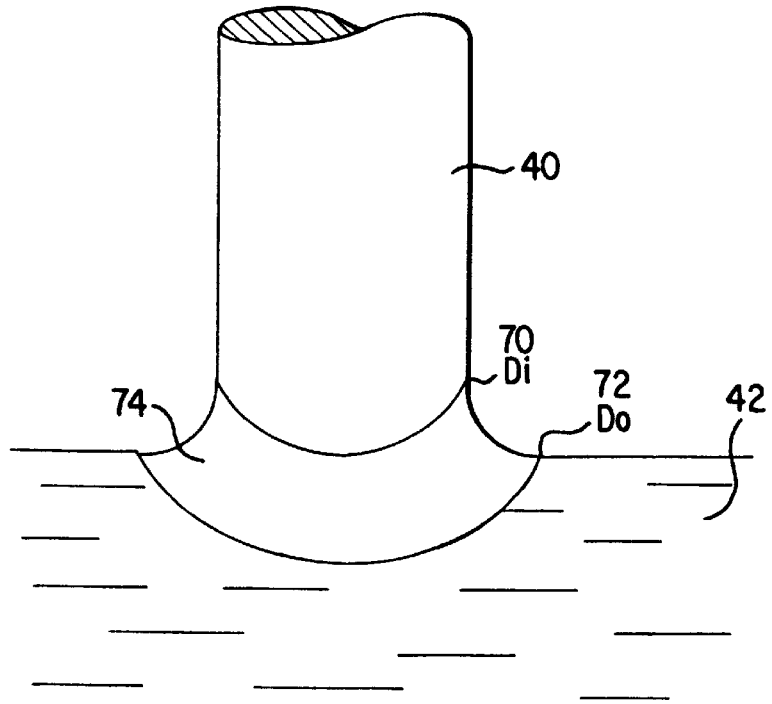
FIG. 1 is an elevational view of the interface between a silicon melt and a single silicon crystal being pulled out of the melt.
Figure 3:
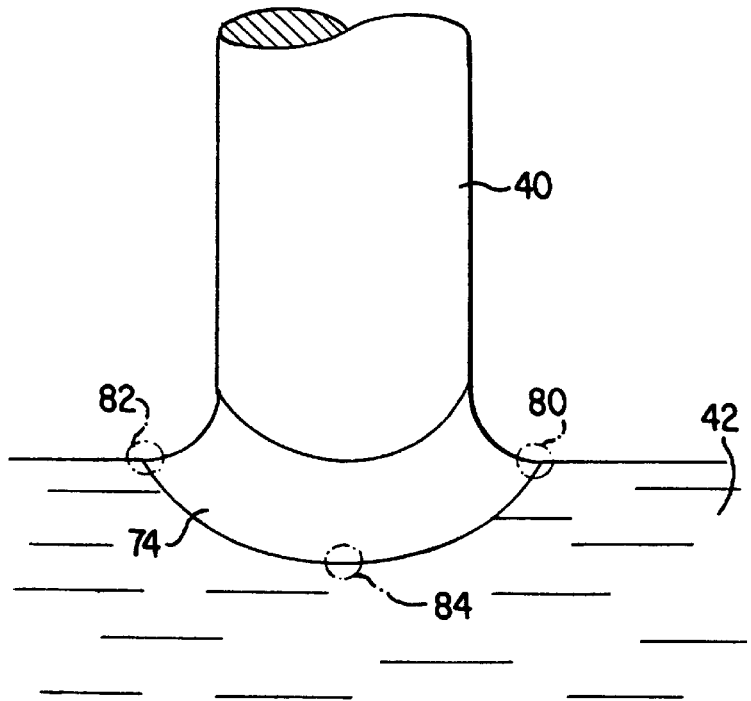
FIG. 3 is an elevational view of the interface between a silicon melt and a single silicon crystal being pulled therefrom showing the diametrically opposed monitoring points of the present invention.

In a preferred embodiment of the present invention, through use of dual optical cameras 52 and 53, the luminous ring 74 is monitored at points 80 and 82 as shown in FIG. 3. Points 80 and 82 will continually measure the diameter by mathematical calculations to determine the distance between the two points. The automated control will then be able to maintain precise diameter and make appropriate changes to the crystal growth system operating parameters to compensate for diameter variations as needed.

Figure 4:
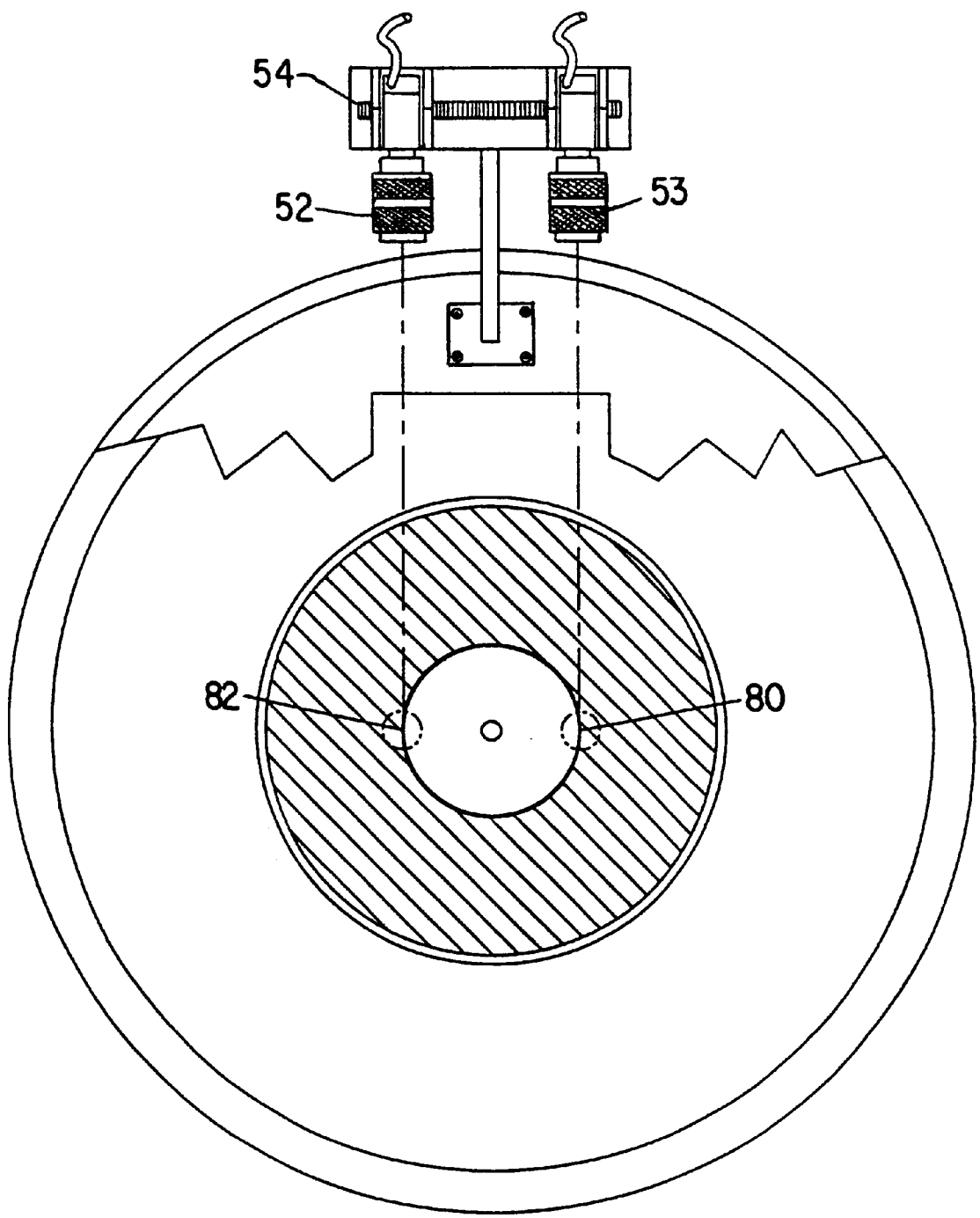
FIG. 4 is plan view of the apparatus of FIG. 2 showing the dual cameras of the present invention.

As shown in FIG. 4, the two cameras 52 and 53 are movably mounted on a threaded platform 54. The platform 54 is also connected to the automatic control system 60 which controls the placement of each camera 52 and 53 by using a motor (not shown) to turn a worm gear. Each camera mount has a threaded gear that interacts with the worm gear allowing the camera to move perpendicular to the longitudinal axis of the crystal. This allows the cameras 52 and 53 to be moved very close together at the start of the necking process, and move outward at a controlled rate until the crystal is at the desired growing diameter. Cameras 52 and 53 are aligned parallel to each other, and each camera can move independently of the other so that it can stay centered on the meniscus of the growing crystal. The spacing of the cameras thus corresponds to the diameter of the crystal. Due to the parallel orientation of the cameras, a true diameter is measured by the two cameras using points 80 and 82, instead of calculating the diameter from the meniscus position and a theoretical center. Consequently, the potential error effects of melt level are eliminated, thus giving a more accurate diameter measurement. It is recognized that some control over melt level can still be beneficial to other parameters when growing the crystal. A number of techniques involving either adjusting the position of the crucible or controlled additions of material to the melt, or both, are known in the art for controlling melt level. If desired, any of the known melt level control techniques can be used in conjunction with the invention.

Since the CCD cameras 52 and 53 in the invention measure the actual diameter of the crystal 40 by viewing diametrically opposed points 80 and 82 on the luminous ring 74 and using pixels in the camera system to determine diameter, it is advantageous to use a camera system with the highest possible resolution. Suitable CCD cameras are commercially available. One camera which has been found to be particularly suitable has 756 horizontal (H)*493 vertical (V) pixels. A lens can be used to control the pixel-per-inch ratio, so that a very high accuracy can be achieved.

The method and apparatus of the invention have the advantage that the diameter measurement obtained therewith is not sensitive to orbit, melt level, or camera angle. The present invention also has the advantage that it is able continuously to monitor and adjust the diameter of the growing crystal from necking through the cone and shoulder and into the desired crystal diameter.

The invention further can make use of known techniques to adjust growth parameters automatically to maintain the desired diameter. For example, the two camera system of the present invention can be used with known automated control methods that interface with optical diameter control methods, such as those described in Baba et al., U.S. Pat. No. 5,138,179; in Bonora, U.S. Pat. No. 3,998,598; in Scholl et al., U.S. Pat. No. 4,350,557 and/or in Katsuoka et al., U.S. Pat. No. 4,915,775; the disclosures of which are each incorporated herein by reference.

The foregoing description and examples have been set forth merely to illustrate the invention and are not intended to be limiting. Since modifications of the disclosed embodiments incorporating the spirit and substance of the invention may occur to persons skilled in the art, the invention should be construed to include all variations within the scope of the appended claims and equivalents thereof.

What is claimed is:

1. A method of measuring the diameter of a crystal pulled from a melt comprising the steps of:
   orienting a first detector to sight said first detector at a first meniscus point where the crystal emerges from the melt;
   orienting a second detector to sight said second detector at a second meniscus point diametrically opposite said first meniscus point;
   determining the spacing between said first and second meniscus points from the orientations of said first and second detectors, said spacing being equal to the crystal diameter.

2. A method according to claim 1, wherein said crystal is a silicon single crystal grown by the Czochralski technique.

3. A method according to claim 1, wherein said first and second detectors are CCD optical cameras.

4. A method according to claim 1, wherein said first and second detectors are aligned parallel to each other and move independently of each other along a transverse track, whereby the spacing of the first and second detectors corresponds to the diameter of the crystal.

5. A method of measuring the diameter of a crystal pulled from a melt comprising the steps of:
   orienting a first detector to sight said first detector at a first meniscus point where the crystal emerges from the melt;
   orienting a second detector to sight said second detector at a second meniscus point diametrically opposite said first meniscus point;
   determining the spacing between said first and second meniscus points from the orientations of said first and second detectors, said spacing being equal to the crystal diameter, and
   measuring the level of the melt and adjusting the melt level to maintain a constant melt level.

6. A method according to claim 5, further comprising automatically adjusting at least one crystal growth condition selected from crystal pulling speed and temperature in response to the measured crystal diameter to regulate the crystal diameter.

7. An apparatus for pulling a crystal from a melt comprising a heated crucible for maintaining a melt, a rotatable and raisable holder for a seed crystal, and first and second detectors oriented toward respective first and second meniscus points at an interface between the crystal and the melt, and means for determining the spacing between said first and second meniscus points from the orientations of said detectors.

8. An apparatus according to claim 7, wherein said first and second detectors comprise CCD optical cameras.

9. An apparatus according to claim 7, further comprising a measuring device for measuring the level of the melt, and a crucible position adjusting device for adjusting the melt level in response to a change in measured value by said measuring device in order to maintain a constant melt level.

10. An apparatus according to claim 7, further comprising a crystal growth condition adjusting device for adjusting at least one crystal growth condition selected from the group consisting of melt temperature and crystal pulling speed in response to a change in measured crystal diameter in order to maintain a constant crystal diameter.

11. An apparatus according to claim 7, wherein said first and second detectors are aligned parallel to each other and can move independently of each other along a transverse track.

* * * * *